(12) United States Patent
Liu et al.

(10) Patent No.: US 9,524,988 B2
(45) Date of Patent: Dec. 20, 2016

(54) ARRAY SUBSTRATE, MANUFACTURING METHOD THEREOF, LIQUID CRYSTAL PANEL AND LIQUID CRYSTAL DISPLAY

(71) Applicants: BOE Technology Group Co., Ltd., Beijing (CN); Beijing BOE Display Technology Co., Ltd., Beijing (CN)

(72) Inventors: Sha Liu, Beijing (CN); Baoqiang Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 459 days.

(21) Appl. No.: 13/995,938

(22) PCT Filed: Nov. 9, 2012

(86) PCT No.: PCT/CN2012/084405
§ 371 (c)(1),
(2) Date: Jun. 19, 2013

(87) PCT Pub. No.: WO2013/113229
PCT Pub. Date: Aug. 8, 2013

(65) Prior Publication Data
US 2015/0200206 A1 Jul. 16, 2015

(30) Foreign Application Priority Data
Jan. 31, 2012 (CN) .......................... 2012 1 0021820

(51) Int. Cl.
*H01L 27/12* (2006.01)
*G02F 1/1362* (2006.01)
(Continued)

(52) U.S. Cl.
CPC ........... *H01L 27/124* (2013.01); *G02F 1/1368* (2013.01); *G02F 1/136286* (2013.01);
(Continued)

(58) Field of Classification Search
CPC . H01L 27/124; H01L 27/1251; H01L 27/1262
See application file for complete search history.

(56) References Cited

U.S. PATENT DOCUMENTS

| | | | |
|---|---|---|---|
| 7,602,465 B2 | 10/2009 | Kim et al. | |
| 2004/0085503 A1 | 5/2004 | Kim et al. | |
| (Continued) | | | |

FOREIGN PATENT DOCUMENTS

| | | |
|---|---|---|
| CN | 101236971 A | 8/2008 |
| CN | 101840117 A | 9/2010 |
| (Continued) | | |

OTHER PUBLICATIONS

First Office Action issued by the Chinese Patent Office for Chinese Patent Application No. 2012103495204 dated Sep. 3, 2014, 6pgs.
(Continued)

*Primary Examiner* — Jaehwan Oh
(74) *Attorney, Agent, or Firm* — Ladas & Parry LLP

(57) ABSTRACT

An array substrate, a manufacturing method thereof, a liquid crystal panel and a liquid crystal display. An array substrate, comprises: a substrate (11), gate lines (2), data lines (4) and common electrode lines (3) disposed on said substrate (11), said gate lines (2) and said data lines (4) define a plurality of pixel units (20, 21); two transparent conductive film layers (12, 19) and thin film transistor are formed in each of said pixel units (20, 21); wherein, said pixel units (20, 21) comprise a first pixel unit (20) and a second pixel unit (21), and the first pixel unit (20) and the second pixel unit (21) are alternately arranged along the direction of said data lines (4); wherein, in said first pixel unit (20), a first transparent
(Continued)

conductive film layer (12) is electrically connected with a common electrode line (3), a second transparent conductive film layer (19) is electrically connected with a drain electrode (16) of a thin film transistor; in said second pixel unit (21), a first transparent conductive film layer (12) is electrically connected with a drain electrode (16) of a thin film transistor, a second transparent conductive film layer (19) is electrically connected with a common electrode line (3); the common electrode lines (3) in the pixel units (20, 21) are electrically connected with each other.

15 Claims, 9 Drawing Sheets

(51) Int. Cl.
  *G02F 1/1368* (2006.01)
  *G09G 3/36* (2006.01)
  *G02F 1/1343* (2006.01)
(52) U.S. Cl.
  CPC ....... *G09G 3/3614* (2013.01); *H01L 27/1251* (2013.01); *H01L 27/1262* (2013.01); *G02F 2001/13685* (2013.01); *G02F 2001/134372* (2013.01); *G09G 3/3648* (2013.01); *G09G 2300/0426* (2013.01); *G09G 2320/0252* (2013.01); *H01L 27/1214* (2013.01)

(56) References Cited

U.S. PATENT DOCUMENTS

| | | | |
|---|---|---|---|
| 2008/0100766 A1* | 5/2008 | Ming | G02F 1/136227 349/44 |
| 2008/0210940 A1 | 9/2008 | Lee et al. | |
| 2011/0304787 A1* | 12/2011 | Wang | G02F 1/134309 349/33 |
| 2012/0081642 A1 | 4/2012 | Park | |
| 2014/0043215 A1 | 2/2014 | Hu | |
| 2015/0214286 A1* | 7/2015 | Niu | H01L 27/3276 257/72 |

FOREIGN PATENT DOCUMENTS

| | | |
|---|---|---|
| CN | 102156359 A | 8/2011 |
| CN | 20120034009 A | 4/2012 |
| CN | 102544029 A | 7/2012 |
| CN | 102629059 A | 8/2012 |
| CN | 102810304 A | 12/2012 |
| CN | 202649652 U | 1/2013 |

OTHER PUBLICATIONS

English translation of First Office Action issued by the Chinese Patent Office for Chinese Patent Application No. 2012103495204 dated Sep. 3, 2014, 4pgs.
Office Action issued by the Korean Patent Office for Korean Patent Application No. 10-2013-0112129 dated Sep. 3, 2014, 4pgs.
English translation of Office Action issued by the Korean Patent Office for Korean Patent Application No. 10-2013-0112129 dated Sep. 3, 2014, 2pgs.
Rejection Decision issued by the Chinese Patent Office for Chinese Patent Application No. 2012100218230.X dated Jun. 13, 2014, 6pgs.
English translation of Rejection Decision issued by the Chinese Patent Office for Chinese Patent Application No. 2012100218230.X dated Jun. 13, 2014, 6pgs.
International Preliminary Report on Patentability for International Application No. PCT/CN2012/084405 dated Aug. 5, 2014, 15pgs.
International Search Report (Chinese language) issued by the International Searching Authority, rendered Feb. 28, 2013, 15 pages.
The State Intellectual Property Office of the People'S Republic of China ("SIPO") (Chinese Language) Office Action issued on Jan. 6, 2014 by SIPO in Chinese Patent Application No. 201210021820.X; eight (8) pages.
English Translation of the State Intellectual Property Office of the People'S Republic of China ("SIPO") Office Action issued on Jan. 6, 2014 by SIPO in Chinese Patent Application No. 201210021820. X; seven (7) pages.
The State Intellectual Property Office of the People'S Republic of China ("SIPO") (Chinese Language) Office Action issued on Apr. 1, 2014 by SIPO in Chinese Patent Application No. 201210021820.X; seven (7) pages.
English Translation of the State Intellectual Property Office of the People'S Republic of China ("SIPO") Office Action issued on Apr. 1, 2014 by SIPO in Chinese Patent Application No. 201210021820. X; five (5) pages.
English Translation of CN101840117(A) listed above, 38 pages.
English Translation of CN102156359(A) listed above, 30 pages.
English Translation of CN102629059(A) listed above, 30 pages.
English Translation of CN101236971(A) listed above, 34 pages.
English Translation of CN202649652(U) listed above, 25 pages.
English Translation of CN102810304(A) listed above, 16 pages.

* cited by examiner

ARRAY SUBSTRATE, MANUFACTURING METHOD THEREOF, LIQUID CRYSTAL PANEL AND LIQUID CRYSTAL DISPLAY

CROSS REFERENCE TO RELATED APPLICATIONS

This application is based on International Application No. PCT/CN2012/084405 filed on Nov. 9, 2012, which claims priority to Chinese National Application No. 201210021820.X, filed on Jan. 31, 2012, the contents of which are incorporated herein by reference.

TECHNICAL FIELD

The present invention relates to an array substrate, a manufacturing method thereof, a liquid crystal panel and a liquid crystal display.

BACKGROUND

At present, liquid crystal displays are the most popular flat panel displays (LCDs), and thin film transistor liquid crystal displays (TFT-LCDs) dominate the market of LCDs. The TFT-LCDs are always formed by assembling an array substrate and a color filter substrate which are opposed to each other and filling with a liquid crystal layer between the array substrate and the color filter substrate. The rotation of liquid crystal molecules is driven by an applied electric field, so that the light selectively transmits through the layer of the liquid crystal molecules, thereby presenting images with different gray levels. The electric field for driving the rotation of the liquid crystal molecules is formed between a pixel electrode and a common electrode. The common electrode is connected to a common electrode line and a common voltage is applied to the common electrode by the common electrode line. The pixel electrode is connected with a data line and an operating voltage is applied to the pixel electrode by the data line. Typically, the common voltage keeps constant, and the magnitude of the operating voltage applied to the pixel electrode is controlled by driving signal sequences, so that the electric field can be varied.

A reverse drive technology is proposed in prior art, in which the electric field in each pixel unit of the TFT-LCD are reversed by using appropriate driving signal sequences, thus the rotation direction of the liquid crystal molecule is alternately changed. With the reverse drive technology, a frame-reverse mode, a row-reverse mode, a column-reverse mode or a frame-reverse mode can be achieved. Point-reverse mode is preferred by the manufacturers due to its uniform display image, high image quality and small coupling between adjacent circuits. The term of "point-reverse" refers to the situation in which, a certain pixel unit is charged by a positive voltage (i.e. the operation voltage is larger than the common voltage) during one frame and charged by a negative voltage (i.e. the operation voltage is smaller than the common voltage) during the next frame, so that a positive electrode and a negative electrode can be achieved alternatively; simultaneously, during a period of one and same frame, the polarity of the voltage in any one pixel unit in entire liquid crystal display panel is opposite to that of the voltages of four pixel units which are adjacent to the one pixel unit in the column and row directions. In a conventional technology, in order to achieve point-reverse, the operating voltage in the data lines for driving the respective pixel units are reversed continually during a period of one frame, so frequently alternate variation of the operating voltage between the high voltage and the low voltage causes that the driving power consumption of the data line is increased, and the development and the application of the large size liquid crystal display panel are restricted.

SUMMARY

According to an embodiment of the present invention, an array substrate, manufacturing method thereof, a liquid crystal panel and a liquid crystal display are provided in order to reduce the driving power consumption for realizing the reverse drive.

To achieve the above object, embodiments of the present invention provide following solutions:

According to an aspect of the invention, an array substrate is provided. The array substrate comprising: a substrate; gate lines, data lines and common electrode lines disposed on said substrate; said gate lines and said data lines define a plurality of pixel units; two transparent conductive film layers and a thin film transistor are formed in each of said pixel units; wherein, said pixel units comprise a first pixel unit and a second pixel unit, and the first pixel unit and the second pixel unit are alternately arranged along the direction of said data lines; wherein, in said first pixel unit, a first transparent conductive film layer is electrically connected with a common electrode line, a second transparent conductive film layer is electrically connected with a drain electrode of a thin film transistor; in said second pixel unit, a first transparent conductive film layer is electrically connected with a drain electrode of a thin film transistor, a second transparent conductive film layer is electrically connected with a common electrode line; the common electrode lines in the pixel units are electrically connected with each other.

According to an aspect of the invention, a method of manufacturing an array substrate is provided, said array substrate comprising a first pixel unit and a second pixel unit, said method comprising:

Depositing a transparent conductive material on a substrate, and forming a pattern of a first transparent conductive film layer corresponding to both a first pixel unit and a second pixel unit by a mask process; wherein said first pixel unit and said second pixel unit are alternately arranged along the direction of a data line;

Forming a first metal film layer and a first semiconductor film layer on the substrate formed with the first transparent conductive film layer, and forming a gate line, a gate electrode and a common electrode line corresponding to the first pixel unit by a mask process, and forming a drain electrode, a source electrode, an active layer and a data line corresponding to the second pixel unit;

Depositing a gate insulating layer, and forming a hole by a mask process;

Fabricating a second semiconductor film layer and a second metal film layer, and forming an active layer, source/drain electrodes and data line corresponding to the first pixel unit by a mask process, and forming a gate line, a gate electrode and a common electrode line corresponding to the second pixel unit;

Depositing a passivation layer, and forming a hole by a mask process;

Depositing a transparent conductive material, and forming a pattern of a second transparent conductive film layer corresponding to both the first pixel unit and the second pixel unit by a mask process; wherein in the first pixel unit, a second transparent conductive film layer is electrically connected with the drain electrode of a thin film transistor by the hole, in the second pixel unit, the second transparent conductive film layer is electrically connected with the common electrode line by the hole.

According to an aspect of the invention, a method of manufacturing an array substrate is provided, said array substrate comprising a first pixel unit and a second pixel unit, said method comprising:

Depositing a transparent conductive material on a substrate, and forming a pattern of a first transparent conductive film layer corresponding to both a first pixel unit and a second pixel unit by a mask process; wherein said first pixel unit and said second pixel unit are alternately arranged along the direction of a data line;

Forming a first metal film layer and a first semiconductor film layer on the substrate formed with the first transparent conductive film layer is formed, and forming a gate line, a gate electrode and a common electrode line corresponding to each of the pixel units by a mask process;

Depositing a gate insulating layer, and forming a hole by a mask process;

Fabricating a second semiconductor film layer and a second metal film layer, and forming an active layer, source/drain electrodes and a data line corresponding to each of the pixel units;

Depositing a passivation layer, and forming a hole by a mask process;

Depositing a transparent conductive material, and forming a pattern of a second transparent conductive film layer corresponding to both the first pixel unit and the second pixel unit by a mask process; wherein in the first pixel unit, a second transparent conductive film layer is electrically connected with the drain electrode of a thin film transistor by the hole, in the second pixel unit, the second transparent conductive film layer is electrically connected with the common electrode line by the hole.

According to an aspect of the invention, a liquid crystal panel is provided, the liquid crystal panel comprises: a color filter substrate, an opposed array substrate, and a liquid crystal layer filled between said color filter substrate and said array substrate, wherein said array substrate is the array substrate according to any one of array substrates described above.

According to an aspect of the invention, a liquid crystal display is provided. The liquid crystal display comprises: a housing and a driving device, and further comprises a liquid crystal panel according to the liquid crystal panel described above, said drive device is respectively connected with gate lines, common electrode lines and data lines of said liquid crystal panel, so as to apply a common voltage to the common electrodes, apply a gate switching voltage to the gate lines and apply an operating voltage to the date lines.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
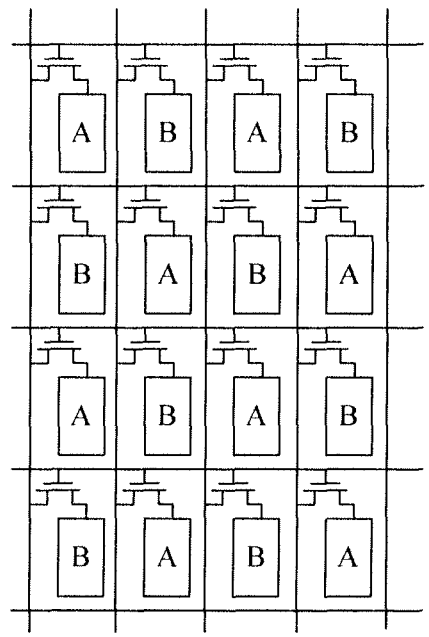
FIG. 1 shows an arrangement manner of a first pixel unit and a second pixel unit in an array substrate according to an embodiment of the present invention.

In order to make objects, technical details and advantages of the embodiments of the invention apparent, the technical solution of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In all embodiments according to the present invention, "disposed in the same layer", for the case of at least two patterns, refers to a structure in which at least two patterns are disposed in the same layer. Specifically, it refers to that at least two patterns are formed of the same material by a mask process in the same layer. For example, the process of forming a gate line and a gate electrode in the same layer may comprise: fabricating a film by using a material, such as molybdenum or copper, and forming a pattern of the gate electrode and the gate line in the film by a mask process. Of course, as is common practice, the pattern of the gate electrode is directly connected with the pattern of the gate line. "Direct connection" is also for the case of at least two patterns. Two patterns which are directly connected with each other may be provided in the same layer, such as the direct connection between the gate line and the gate electrode; two patterns which are directly contacted with each other also may be respectively provided in adjacent layers, such as the direct contact connection between the drain electrode 16 and the first transparent conductive film layer 12 (which is provided as a pixel electrode), shown in the right drawing in FIG. 4. In contrast to the direct connection, an electrical connection achieved by holes is also provided. "Two patterns are electrically connected with each other by a hole" refers to that two patterns disposed in the two nonadjacent layers between which there is a film provided as a insulating layer, the two patterns respectively disposed in the two nonadjacent layers are electrically connected with each other by a hole in the insulating layer; for example, shown in the left drawing in FIG. 4, the passivation layer 18 is disposed between the second transparent conductive film layer 19 (which is provided as the pixel electrode) and the drain electrode 16, the transparent conductive film 19 provided as the pixel electrode is electrically connected with the drain electrode 16 by a hole 181 in the passivation layer.

An embodiment according to the present invention provides an array substrate, comprising: a substrate; gate lines, data lines and common electrode lines disposed on said substrate, said gate lines and said data lines define a plurality of pixel units; two transparent conductive film layers and a thin film transistor are formed in each of said pixel units. All of said pixel units are divided into two pixel unit types, i.e., a first pixel unit and a second pixel unit, and the first pixel unit and the second pixel unit are alternately arranged along the direction of said data lines; wherein, in said first pixel unit, a first transparent conductive film layer is electrically connected with a common electrode line, a second transparent conductive film layer is electrically connected with a drain electrode of a thin film transistor; in said second pixel unit, a first transparent conductive film layer is electrically connected with a drain electrode of a thin film transistor, a second transparent conductive film layer is electrically connected with a common electrode line; the common electrode lines in the pixel units are electrically connected with each other.

With the above described structural arrangement, in the first pixel unit, the first conductive film layer is provided as a common electrode in the first pixel unit and the second conductive film layer is provided as a pixel electrode in the first pixel unit; in the second pixel unit, the first conductive film layer is provided as a pixel electrode in the second pixel unit and the second conductive film layer is provided as a common electrode in the second pixel unit. Therefore, the positions of the common electrode and the pixel electrode in the first pixel unit are opposite to those in the second pixel unit. As a result, while the operating voltages with the same polarity are applied to the first pixel unit and the second pixel unit respectively, two electric fields in opposite directions are formed in the respective positions between the pixel electrode and the common electrode of the first and second pixel units, respectively. Thus, it is possible to make the directions of the electric fields in the first and second pixel units reverse without reversing the operating voltage applied to the data line, so that the driving power consumption for realizing reverse drive can be decreased.

Alternatively, the thin film transistor in each of the first pixel unit and the second pixel unit is of top-gate structure. In the first pixel unit, the second transparent conductive film layer is electrically connected with the drain electrode of the top-gate structure thin film transistor by a hole in the first insulating layer. When the common electrode line and the gate line in the first pixel unit are disposed in the same layer, in the first pixel unit, the first transparent conductive film layer is directly connected with the common electrode line; when the common electrode line and the data line in the first pixel unit are disposed in the same layer, in the first pixel unit, the first transparent conductive film layer is connected with the common electrode line by a hole in the gate insulating layer. In the second pixel unit, the first transparent conductive film layer is directly connected with the drain electrode of the top-gate structure thin film transistor, when the common electrode line and the gate line in the second pixel unit are disposed in the same layer, the second transparent conductive film layer is electrically connected with the common electrode line by a hole in the gate insulating layer; when the common electrode line and the data line in the second pixel unit are disposed in the same layer, the second transparent conductive film layer is electrically connected with the common electrode line by holes in each of the gate insulating layer and the passivation layer. In the second pixel unit comprising top-gate structure thin film transistor, since the metal of the source/drain electrode is directly formed on the first transparent conductive film layer, namely, on the pixel electrode of the second pixel unit, the loss of the aperture ratio caused by charging the pixel electrode in the thin film transistor by the though hole in the prior art can be avoided, and the image quality can be improved. At the same time, in the second pixel unit comprising top-gate structure thin film transistor, the contact between an active layer and the gate electrode is provided in a three-dimensional form, compared with the pixel unit comprising the bottom-gate structure thin film transistor, the contact area of the active layer and the gate can be larger, thus the conductivity of the thin film transistor channel can be increased.

Alternatively, the thin film transistor of the first pixel unit is of bottom-gate structure, in said first pixel unit, the second transparent conductive film layer is electrically connected with the drain electrode of the bottom-gate structure thin film transistor by the though hole in the passivation layer; when the common electrode line and the gate line in the first pixel unit are disposed in the same layer, the first transparent conductive film layer is directly connected with the common electrode line, when the common electrode line and the data line in the first pixel unit are disposed in the same layer, the first transparent conductive film layer is electrically connected with the common electrode line by the hole in the gate insulating layer. The thin film transistor of the second pixel unit is of top-gate structure, the first transparent conductive film layer in the second pixel unit is directly connected with the drain electrode of the top-gate thin film transistor. When the common electrode line and the gate line in the second pixel unit are disposed in the same layer, the second transparent conductive film layer is electrically connected with the common electrode line by the hole in the gate insulating layer; when the common electrode line and the data line in the second pixel unit are disposed in the same layer, the second transparent conductive film layer is electrically connected with the common electrode line by the holes in each of the gate insulating layer and the passivation layer. In the second pixel unit comprising top-gate structure thin film transistor, since the metal of the source/drain electrode is directly disposed on the first transparent conductive film layer, namely on the pixel electrode of the second pixel unit, the loss of the aperture ratio caused by charging the pixel electrode in the thin film transistor by the though hole in the prior art can be avoided and the image quality can be improved. At the same time, in the second pixel unit comprising top-gate structure thin film transistor, the contact between an active layer and the gate is provided in a three-dimensional form, compared with the first pixel unit comprising the bottom-gate structure thin film transistor, the contact area of the active layer and the gate is larger, thus the conductivity of the thin film transistor channel is increased.

Alternatively, the common electrode line in each pixel unit can be arranged in two different manners: the common electrode line in each pixel unit and the gate line in the same pixel unit are disposed in the same layer, or the common electrode line in each pixel unit and the data line in the same pixel unit are disposed in the same layer. Therefore, the electrical connection of the common electrode line in each of the pixel units, for example, is that: when the common electrode lines in adjacent pixel units are in the same layer along the direction of the gate line, the common electrode lines in adjacent pixel units are directly connected with each other; when the common electrode lines in the adjacent pixel units are disposed in the respective different layers along the direction of the gate line, the common electrode lines in adjacent pixel units are electrically connected with each other by the holes in gate insulating layer.

Alternatively, along the direction of gate line, the first pixel unit and the second pixel unit are alternately arranged (shown in FIG. 1). Under the circumstance that the thin film transistor of each of the first pixel unit and the second pixel unit is of top-gate structure, the gate line in the first pixel unit is connected with the gate line in the second pixel unit in the same layer, and the data line in the first pixel unit is connected with the data line in the second pixel unit in the same layer. Under the circumstance that the thin film transistor of the first pixel unit is of bottom-gate structure and the thin film transistor of the second pixel unit is of top-gate structure, along the direction of the gate line, the gate line in one first pixel unit is electrically connected to the gate line in adjacent first pixel unit by the hole in the gate insulating layer. Along the direction of data line, the data line in the first pixel unit is electrically connected with the data line in the second pixel unit adjacent to the first pixel unit by the hole in gate insulating layer. With the arrangement and connection manner described above, a data driving signal for frame-reverse drive is input to the data line, and the point-reverse can be achieved merely by reversing the operating voltage once per frame. Compared with the prior art, the driving power consumption can be significantly decreased, while a better effect of the reverse drive can be achieved.

Figure 2:
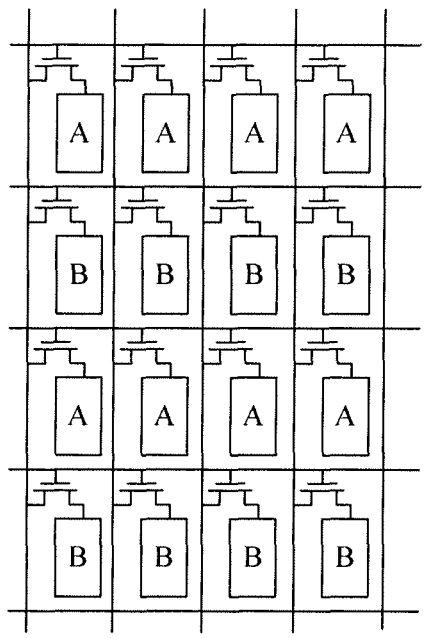
FIG. 2 shows another arrangement manner of a first pixel unit and a second pixel unit in an array substrate according to an embodiment of the present invention.

Alternatively, all of adjacent pixel units along the direction of the gate line are the first pixel units or second pixel units (shown in FIG. 2). Under the circumstance that the thin film transistor in each of the first pixel unit and the second pixel unit is of the top-gate structure, the gate lines in the first and second pixel units are connected with each other in the same layer, and the data lines in the first and second pixel units are connected with each other in the same layer. Under the circumstance that the thin film transistor in the first pixel unit is of bottom-gate structure and the thin film transistor in the second pixel unit is of top-gate structure, along the direction of the gate line, the gate line in the first pixel unit is directly connected with the gate line in the second pixel unit adjacent to the first pixel unit. Along the direction of the data line, the data line in the first pixel unit is electrically connected with the data line in the second pixel unit adjacent to the first pixel unit by a hole in the gate insulating layer. With the arrangement and connection manner described above, a data driving signal for column-reverse drive is input to the data line, and the point-reverse can be achieved merely by reversing the operating voltage once per frame. Compared with the prior art, the driving power consumption can be significantly decreased while the effect of the reverse drive can be achieved better.

Figure 3:
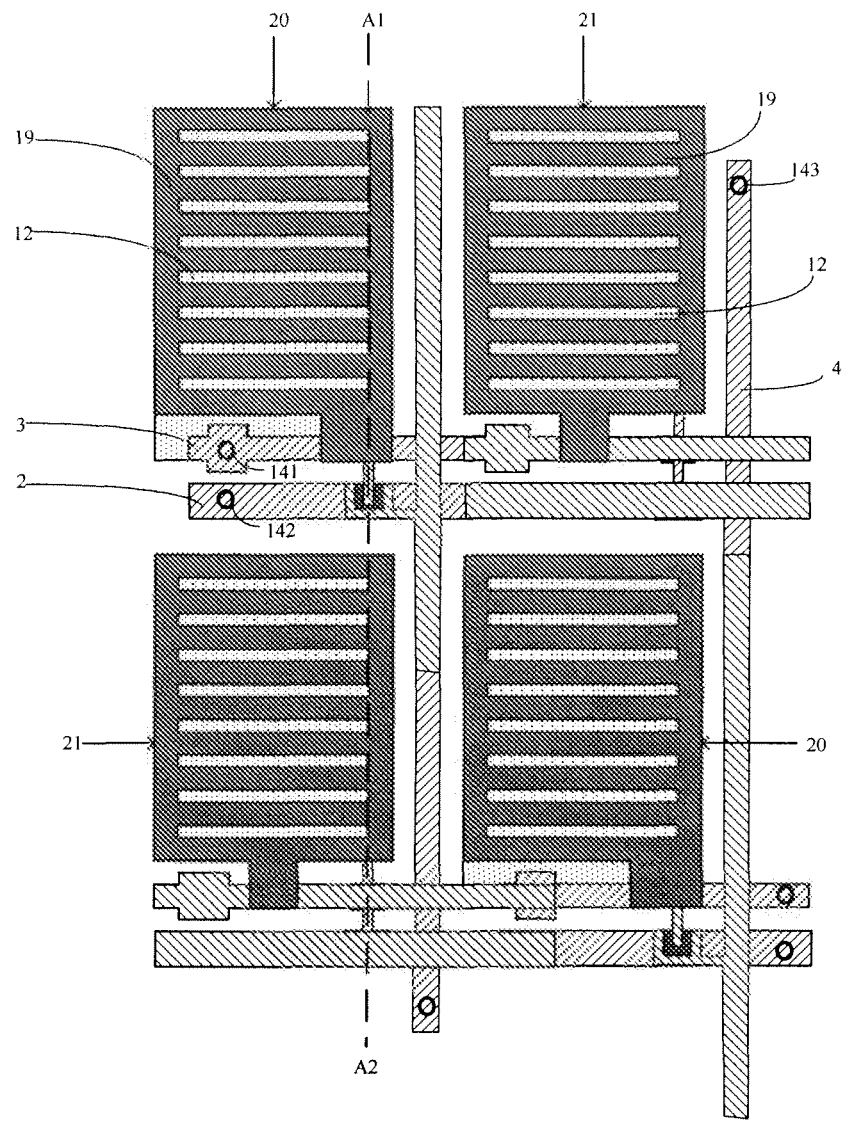
FIG. 3 is a schematic view showing a structure of a first pixel unit and a second pixel unit in the array substrate according to an embodiment of the present invention.
Figure 4:
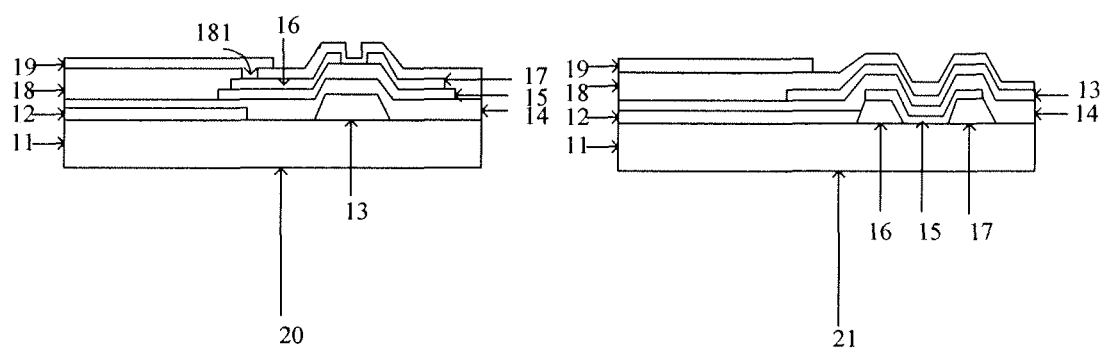
FIG. 4 is a cross-sectional view partially illustrating the structure taken along a sectional line A1-A2 in FIG. 3.

Referring to FIG. 3 and FIG. 4, a specific structure of an array substrate to an embodiment of the present invention will be described by taking an illustrative example in which the first pixel unit and the second pixel unit are alternately arranged along both directions of the gate line and the data line, namely arranged as shown in FIG. 1, and the common electrode line in each pixel unit and the gate line in the same pixel unit are disposed in the same layer and are parallel to each other.

The array substrate according to the embodiment of the present invention, comprises date lines 4 and the gate lines 2 intersected with each other on a base substrate 11, common electrode lines 3, and the first pixel units 20 and the second pixel units 21 defined by the data line 4 and the gate line 2 intersected with each other. FIG. 3 is a top view showing four adjacent pixel units in the array substrate according to the embodiment of the present invention, in which the first pixel units and the second pixel units are alternately arranged along both the directions of the gate line and data line, and the common electrode line in each first pixel unit and the gate line in the same pixel unit are disposed in the same layer and parallel to each other. FIG. 4 is a schematic cross-sectional view taken along a sectional line A1-A2 in FIG. 3, in which the first pixel unit 20 comprises: the gate line 2 extended along horizontal direction; the data line 4 extended along vertical direction; the common electrode lines 3 disposed in the same layer of the gate line 2 and parallel to the gate line 2; a first transparent conductive film layer 12; a bottom-gate thin film transistor consisting of a gate electrode 13, a insulating layer 14, a active layer 15, a drain electrode 16 and a source electrode 17; a passivation layer 18; and a second transparent conductive film layer 19. The gate electrode 13 and the gate line 2 are disposed in the same layer, the first transparent conductive film layer 12 provided as the common electrode in the first pixel unit 20 is directly connected with the common electrode line 3 by disposing the first transparent conductive film layer and the common electrode line in adjacent relationship. The second transparent conductive film layer 19 provided as the pixel electrode of the first pixel unit 20 is electrically connected with the drain electrode 16 of the bottom-gate thin film transistor by a hole 181 in the passivation layer. The pixel electrode has a grid shape with slits formed therein, whereas the common electrode has a plate shape without slits. The second pixel unit 21 comprises: the gate line 2 extended along horizontal direction; the data line 4 extended along vertical direction; the common electrode line 3 disposed in the same layer of the gate line 2 and parallel to the gate line 2; the first transparent conductive film layer 12; a top-gate thin film transistor consisting of a gate electrode 13, a insulating layer 14, an active layer 15, a drain electrode 16 and a source electrode 17; a passivation layer 18; and a second transparent conductive film layer 19. The gate electrode 13 and the gate line 12 are in the same layer, the first transparent conductive film layer 12 provided as the pixel electrode in the second pixel unit 21 and the drain electrode 16 of the top-gate thin film transistor are respectively formed in two adjacent layers and contact with each other in order to realize the direct connection. The second transparent conductive film layer 19 provided as the common electrode in the second pixel unit 21 is electrically connected with the common electrode line 3 by a though hole 182 in the passivation layer. The pixel electrode has a grid shape with slits formed therein, whereas the common electrode has a plate shape without silts.

In FIG. 3, the first pixel unit 20 and the second pixel unit 21 can be arranged alternately along the direction of the gate line. Furthermore, the common electrode line 3 in each pixel unit 20 and the gate line 2 in the same pixel unit 20 are disposed in the same layer and parallel to each other. Along the direction of the gate line 2, the gate lines 2 in the first pixel unit 20 and the second pixel unit 21 are disposed in different layers, and the common electrode line 3 in the first pixel unit 20 and the second pixel unit 21 are also disposed in different layers. The gate line 2 and the common electrode line 3 in the first pixel unit 20 are respectively electrically connected with the gate line 2 and the common electrode line 3 in the second pixel unit 21 adjacent to the first pixel unit 20 by the holes 142,141 in the gate insulating layer. Along the direction of the data line 4, the date line 4 in the first pixel unit 20 is electrically connected with the data line 4 in the second pixel unit 21 adjacent to the first pixel unit 20 by the hole 143 in the gate insulating layer. According to the knowledge in the art and the description above, it should be obvious for those skilled in the art that when the common electrode line and the data line are disposed in the same layer and parallel to each other, the common electrode line, data line and the gate line in each of the adjacent pixel units are arranged in such a connection manner as shown in FIG. 1. Meanwhile, it also should be obvious that when the common electrode line and the gate line are disposed in the same layer and parallel to each other, the common electrode line, the data line and the gate line in each of the adjacent pixel units are arranged in such a connection manner as shown in FIG. 2. Herein, detailed descriptions are omitted.

Figure 5:
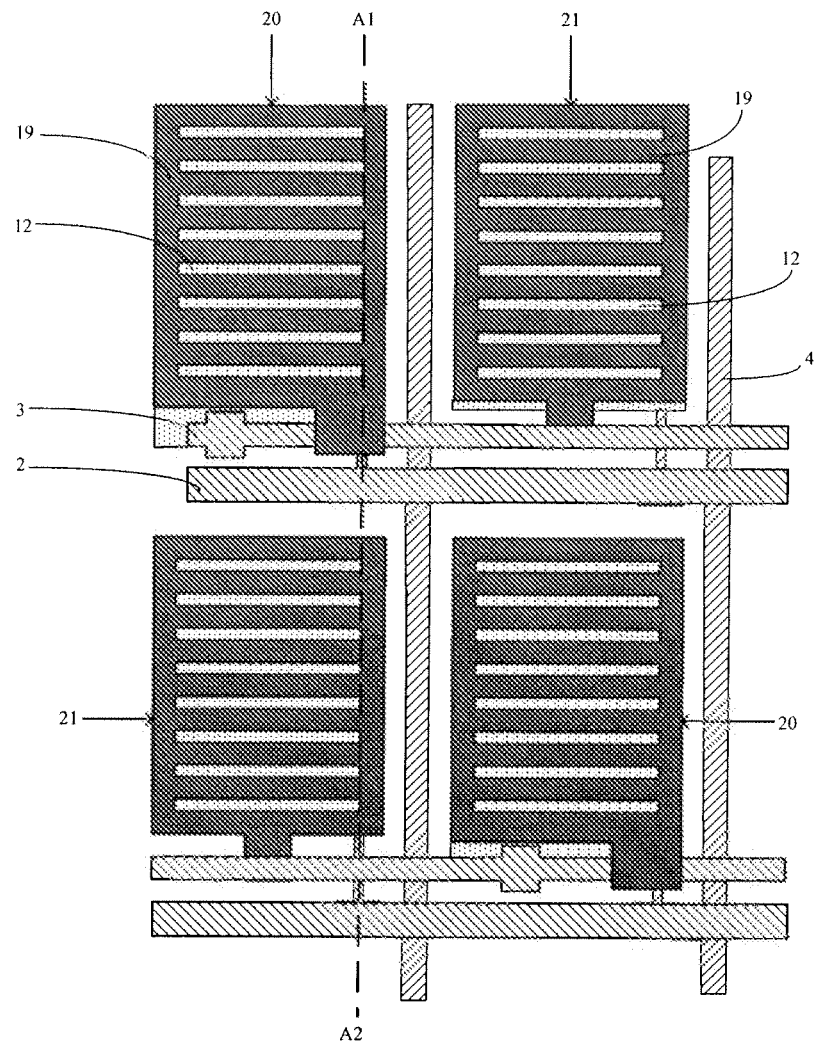
FIG. 5 is a schematic view showing a structure of a first pixel unit and a second pixel unit in the array substrate according to another embodiment of the present invention.
Figure 6:
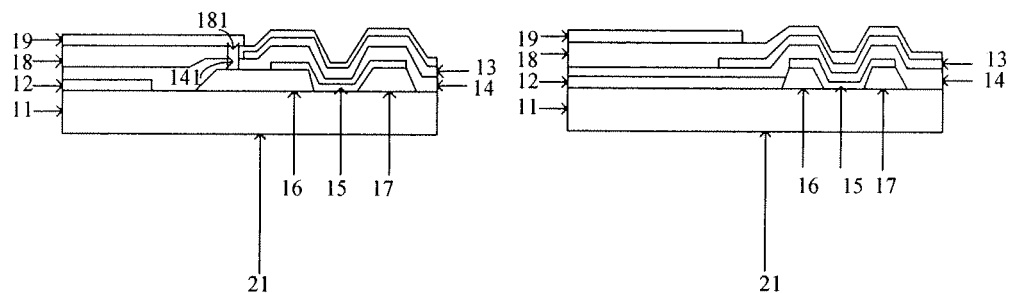
FIG. 6 is a cross-sectional view partially showing the structure taken along a sectional line A1-A2 in FIG. 5.

Another array substrate according an embodiment of the present invention is shown in FIG. 5 and FIG. 6, the difference from the array substrate according to the previous embodiment is that: the thin film transistor in the first pixel unit is of top-gate structure, in which the first transparent conductive film layer 12 provided as the common electrode in the first pixel unit is electrically connected with the common electrode line provided in the same layer of the gate electrode 13 by the hole in the gate insulating layer (not shown in FIG. 5). The second transparent conductive film layer 19 provided as the pixel electrode in the first pixel unit is electrically connected with the drain electrode 16 of the bottom-gate thin film transistor by the hole 181 in the passivation layer and, and the hole 141 in the gate insulating layer.

With the array substrate according to the embodiment of the present invention, when the first pixel unit and the second pixel unit are alternately arranged along each of the gate line and the data line (i.e. the arrangement manner as shown in FIG. 1), the point-reverse can be achieved by applying the operating voltage of frame-reverse to the data line, thus the driving power consumption can be decreased.

Figure 7:
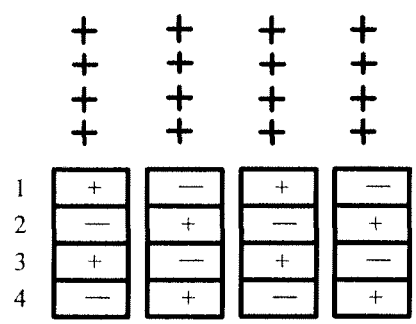
FIG. 7 is a schematic view showing the relationship between the polarities of the operating voltage and the electric field of a pixel unit with a first pixel unit and a second pixel unit being arranged according to FIG. 1.
Figure 7:
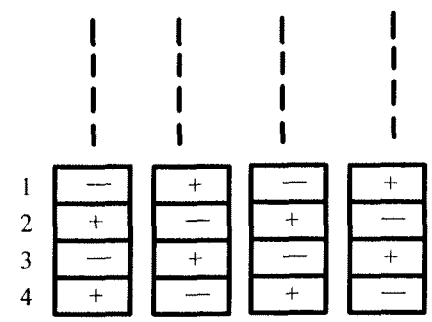

For instance, FIG. 7 is a schematic view showing the relationship between the polarities of the operating voltage polarity and the electric field of a pixel unit with a first pixel unit 20 and a second pixel unit 21 being arranged according to FIG. 1, in which the pixel units arranged in 4×4 matrix are shown. A sequence of the operating voltage signal is shown in the upper portion of FIG. 7. The polarities of the electric fields in the respective pixel units are shown in the lower portion of FIG. 7. The data signals of frame-reverse are applied to the data lines, namely the operating voltage applied to the respective adjacent data lines is kept at the same polarity during one frame. The left drawing of FIG. 7 is a schematic view showing the relationship between the polarities of the operating voltage and the electric field of a pixel unit during one frame, while the right drawing of FIG. 7 is a schematic view showing the relationship between the polarities of the operating voltage and the electric field of a pixel unit during next one frame. In such a way, the point-reverse can be achieved merely by reversing the voltage once per frame. Compared with the prior art in which point-reverse is achieved by continually reversing the operating voltage applied to the data line for driving each of the pixel units during one frame, the driving power consumption can be significantly decreased, while a better effect of the reverse drive can be achieved. In addition, the delay of the signal from the data line can be decreased due to the manner of frame-reverse drive, thus the charging rate of the pixel can be improved.

With the array substrate according to the embodiment of the present invention, when the first pixel unit and the second pixel unit are alternately arranged along the direction of the data line and all of the adjacent pixel units are the first pixel units or the second pixel units along the direction of the gate line (i.e. the arrangement manner as shown in FIG. 2), the point-reverse can be achieved by applying the operating voltage of column-reverse to the data line, thus the driving power consumption can be decreased.

Figure 8:
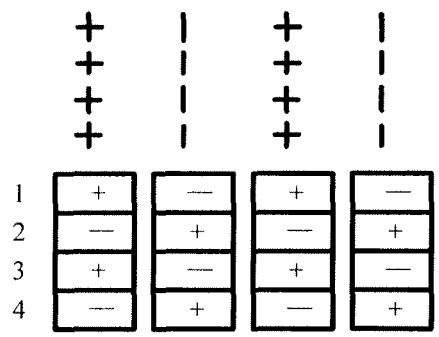
FIG. 8 is a schematic view showing the relationship between the polarities of an operating voltage and an electric field of a pixel unit with a first pixel unit and a second pixel unit being arranged according to the FIG. 2.
Figure 8:
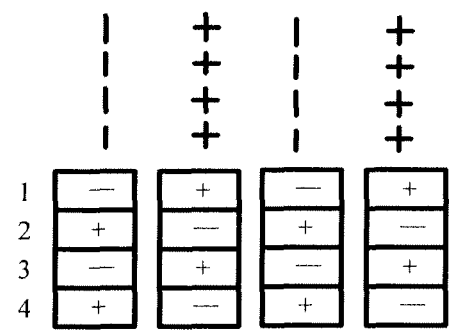
Figure 9:
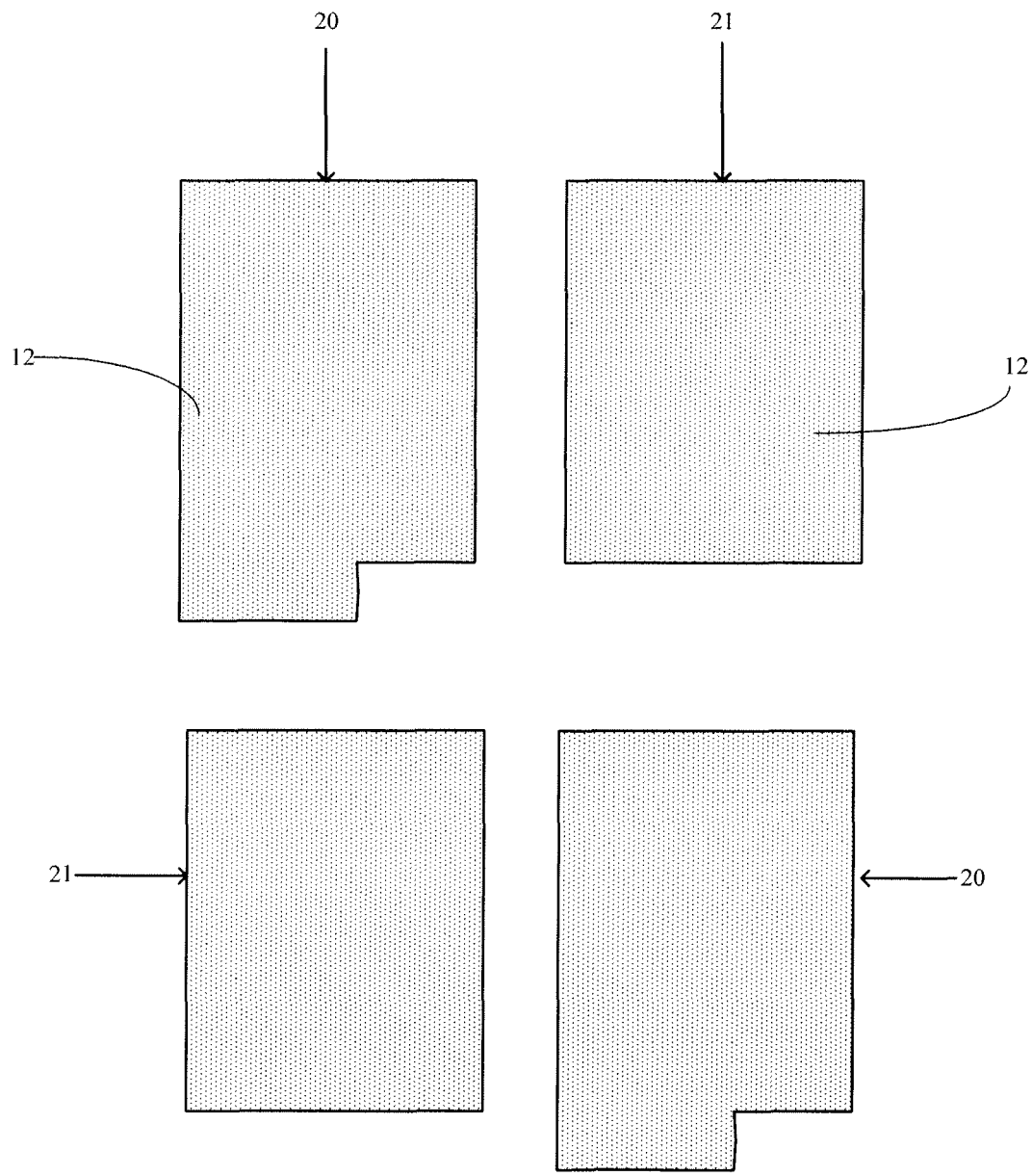
FIG. 9 is a schematic view showing a first structure state during a method of manufacturing an array substrate according to an embodiment of the invention.

FIG. 8 is a schematic view showing the relationship between the polarities of the operating voltage and the electric field of a pixel unit with a first pixel unit 20 and a second pixel unit 21 being arranged according to FIG. 2, in which the pixel units arranged in 4×4 matrix are shown. A sequence of the operating voltage signal is shown in the upper portion of FIG. 8. The polarities of the electric fields in the respective pixel units are shown in the lower portion of FIG. 8. The data signals of column-reverse are applied to the data lines, namely the operating voltage applied to the respective adjacent data lines is kept at the same polarity during one frame. The left drawing of FIG. 8 is a schematic view showing the relationship between the polarities of the operating voltage and the electric field of a pixel unit during one frame, the right drawing of FIG. 8 is a schematic view showing the relationship between the polarities of the operating voltage and the electric field of a pixel unit during next one frame. In such a way, the point-reverse is achieved merely by reversing the voltage once per frame. Compared with the prior art in which point-reverse is achieved by reversing the operating voltage applied to the data line for driving each of the pixel units continually during one frame, the driving power consumption can be significantly decreased while a better effect of the reverse drive can be achieved.

A method of manufacturing an array substrate is also provided according to the embodiment of the present invention, said array substrate comprises a first pixel unit and a second pixel unit. Referring to FIGS. 9-13 and FIG. 3, the method comprises:

901, depositing a transparent conductive material on a substrate, then forming a pattern of a first transparent conductive film layer corresponding to the first pixel unit and the second pixel unit by a mask process.

In which, the first pixel unit and the second pixel unit are alternately arranged along the direction of the data line. For example, shown in FIG. 9, the transparent conductive film is deposited on the substrate 11, and then the transparent conductive film is formed into the common electrode of the first pixel unit 20 and the pixel electrode of the second pixel unit 21 on a surface of the substrate 11 by a mask process. So-called mask process can be any process for forming a pattern by processing the film, typically that is the process comprising exposing, etching and removing photoresist.

902, forming a first metal film layer and a first semiconductor film layer on the substrate formed with the first transparent conductive film layer, and then forming a gate line, a gate electrode and a common electrode line corresponding to each of the pixel units by a mask process.

Figure 10:
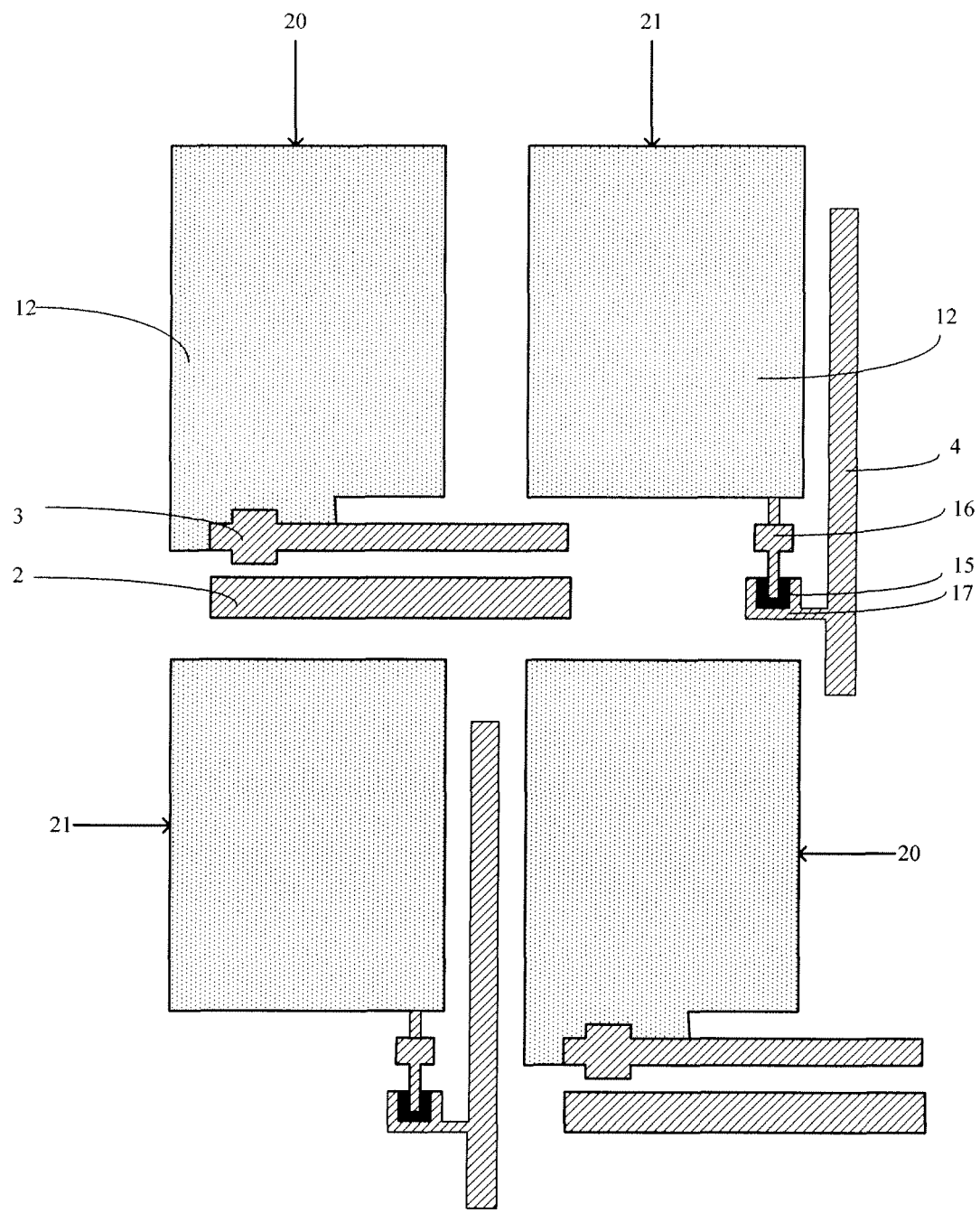
FIG. 10 is a schematic view showing a second structure state during a method of manufacturing an array substrate according to an embodiment of the invention.

For example, shown in FIG. 10, the first metal film layer and the first semiconductor film layer are formed on the substrate formed with the first transparent conductive layer, and then the gate line 2, the gate electrode 13, the common electrode line 3 corresponding to the first pixel unit 20, and the drain electrode 16, the source electrode 17, active layer 15 and the data line 14 corresponding to the second pixel unit 21 are formed by a mask process. In which, one end of each of the gate line 2 and the common electrode line 3 in the first pixel unit (corresponding to the right end of each of the gate line 2 and the common electrode line 3 in the first pixel unit 20 in FIG. 11) is extended to the second pixel unit 21, and one end of the data line 4 in the second pixel unit 21 (corresponding to the lower end of the data 4 in the second pixel unit in FIG. 11) is extended to the first pixel unit 20. Certainly, it also can be that both ends of each of the gate line 2 and the common electrode line 3 in the first pixel unit 20 are extended to the second pixel unit 21, and both ends of the data line 4 in the second pixel unit 21 are extended to the first pixel unit 20.

Figure 11:
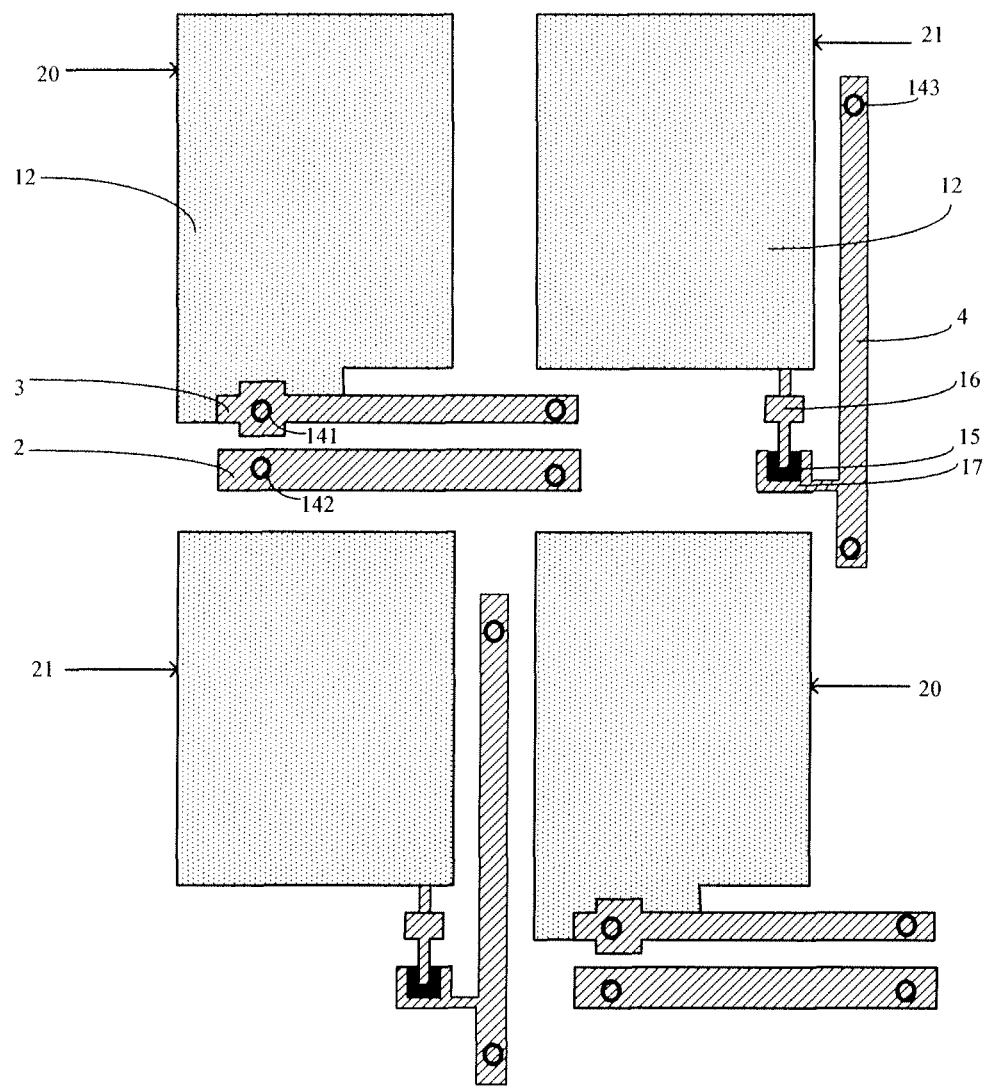
FIG. 11 is a schematic view showing a third structure state during a method of manufacturing an array substrate according to an embodiment of the invention.

As shown in FIG. 11, a gate insulating layer is deposited; and the holes 142 in the gate insulating layer are formed at both ends of the gate line 2 in the first pixel unit 20 by a mask process, and the holes 143 in the gate insulating layer are formed at both ends of the common electrode line 3 in the first pixel unit 20 by a mask process. The holes 143 in the gate insulating layer are formed at both ends of the date line 4 of the second pixel unit 21.

Figure 12:
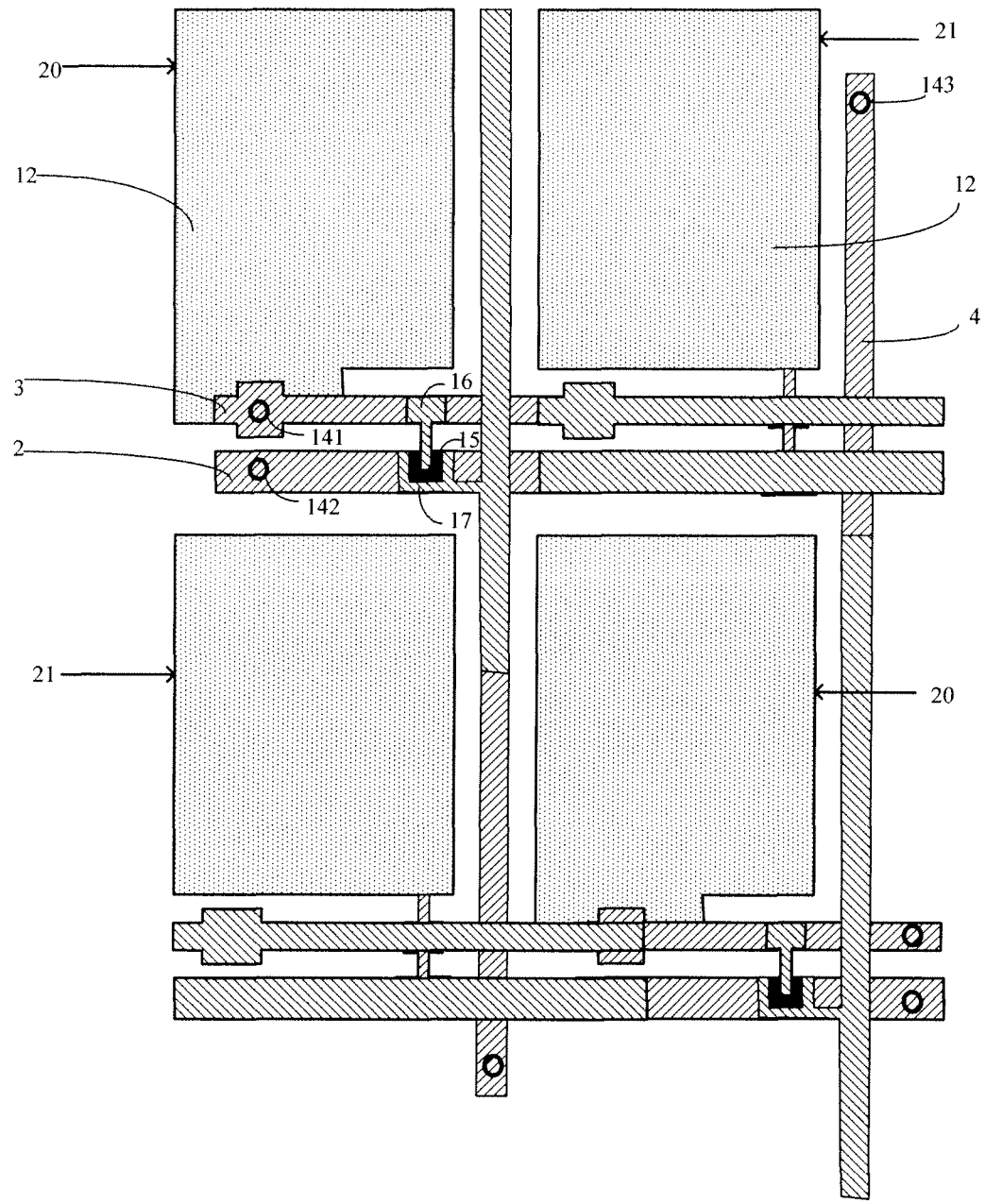
FIG. 12 is a schematic view showing a fourth structure state during a method of manufacturing an array substrate according to an embodiment of the invention.

As shown in FIG. 12, a second semiconductor film layer and a second metal film layer is fabricated; and the active layer 15, drain electrode 16, source electrode 17 and data line 4 corresponding to the first pixel unit 20 and the gate line 2, gate electrode 13 and the common electrode line 3 corresponding to the second pixel unit 21 are formed by a mask process. In which, the holes 143 in the gate insulating layer are covered by both ends of the data line 4 in the first pixel unit 20, the holes 142 in the gate insulating layer are covered by both ends of the gate line 2 in the second pixel electrode 21, and the holes 141 in the gate insulating layer are covered by both ends of the common electrode line 3 in the second pixel electrode 21. Thus, in the first pixel unit 20, each of the gate line 2, the common electrode line 3 and the data line 4 which is disposed in the different layer from the corresponding one in adjacent second pixel unit 21 is electrically connected with the corresponding one in adjacent second pixel unit 21 by the hole 142,141 and 143 in the gate insulating layer, respectively.

903, depositing the passivation layer, and forming the hole therein by a mask process.

Figure 13:
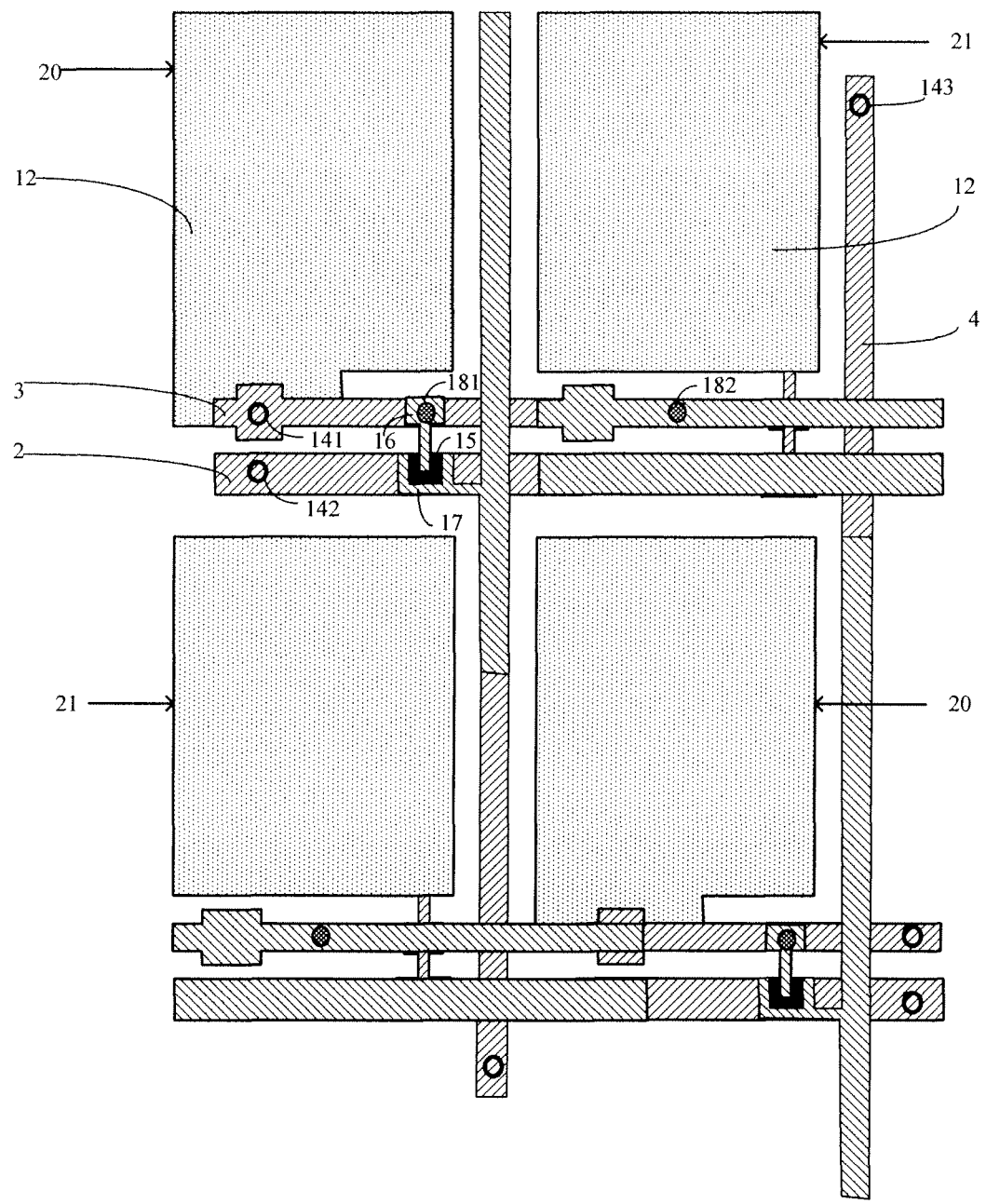
FIG. 13 is a schematic view showing a fifth structure state during a method of manufacturing an array substrate according to an embodiment of the invention.

As shown in FIG. 13, the passivation layer is deposited, and then the hole 181 in the passivation layer is formed in the position corresponding to the drain electrode 16 in the first pixel unit 20, and the hole 182 in the passivation layer is formed on the common electrode line 3 in the second pixel unit 21.

904, depositing the transparent conductive material, and then forming a pattern of the second transparent conductive film layer corresponding to the first and second pixel units.

For example, as shown in FIG. 13, the transparent conductive film is deposited, and then the pixel electrode corresponding to the first pixel unit 20 and the common electrode corresponding to the second pixel unit 21 are formed by the mask process. In which, in the first pixel unit 20, the pixel electrode is electrically connected with the drain electrode 16 of the thin film transistor by the hole 181 in the passivation layer; in the second pixel unit 21, the common electrode is electrically connected with the common electrode line by the hole 182 in the passivation layer.

In the method of manufacturing an array substrate according to the embodiment of the present invention, the pattern in each of layers can be varied by modifying the mask used in the mask process, so as to fabricate the bottom-gate structure thin film transistor and the top-gate structure thin film transistor respectively in the first and second pixel units which are alternately arranged along the direction of the data lines, therefore, the positions of the common electrode and the pixel electrode in the first pixel unit are opposite to those in the second pixel unit. While the operating voltage with the same polarity is applied to the first and second pixel units respectively, two electric fields in opposite directions are formed in the respective positions between the pixel electrode and the common electrode in the first and second pixel units, respectively. Thus it is possible to make the directions of the electric fields in the first and second pixel units reverse without reversing the operating voltage applied to the data line, so that the driving power consumption for realizing reverse drive can be decreased.

It should be noted that, the above steps are described by an example in which the first pixel unit and the second pixel unit are arranged alternately along the direction of each of the gate line and the data line (i.e. arrangement as shown in FIG. 1), those who skilled in the art can easily manufacture the array substrate in which all of the adjacent pixel units are the first pixel units or the second pixel units (i.e. arrangement as shown in FIG. 2) along the direction of the gate line by incorporating their common knowledge into the aforementioned manufacturing method. Therefore, detailed descriptions are not provided.

A method of manufacturing an array substrate according to another embodiment of the present invention is provided, said array substrate comprises a first pixel unit and a second pixel unit, the method comprises:

1001, depositing a transparent conductive material on a substrate, and forming a pattern of a first transparent conductive film layer corresponding to both the first pixel units and the second pixel units by a mask process; wherein said first pixel unit and said second pixel unit are alternately arranged along the direction of a data line.

1002, forming a first metal film layer and a first semiconductor layer on the substrate formed with a first transparent conductive film layer, and forming gate line, gate electrode and common electrode line corresponding to each of the pixel units by a mask process.

1003, depositing a gate insulating layer, and forming a hole by a mask process.

1004, fabricating a second semiconductor film layer and a second metal film layer, and forming an active layer, source/drain electrodes and a data line corresponding to each of the pixel units.

1005, depositing a passivation layer, and forming a hole by a mask process.

1006, depositing a transparent conductive material, and forming a pattern of the second transparent conductive film layer corresponding to both the first pixel unit and the second pixel unit by a mask process; wherein in the first pixel unit, a second transparent conductive film layer is electrically connected with the drain electrode of a thin film transistor by the hole; in the second pixel unit, the second transparent conductive film layer is electrically connected with the common electrode line by the hole.

A liquid crystal panel according to the embodiment of the present invention is also provided, which comprises the aforementioned array substrate according to any one of embodiments of the present invention, and further comprises a color filter substrate, which is opposed to the array substrate, and a liquid crystal layer filled between said color filter substrate and said array substrate, said color filter substrate can be a color filter substrate with a black matrix and a color filter layer formed on a substrate.

A liquid crystal display according to the embodiment of the present invention is also provided, which comprises: a housing and a driving device, and further comprises the aforementioned liquid crystal panel according to any one of embodiments of the present invention, said driving device is respectively connected with gate lines, common electrode lines and data lines of said liquid crystal panel, so as to apply a common voltage to the common electrodes, apply a gate switching voltage to the gate lines and apply an operating voltage to the date lines.

The layer hierarchy and patterns of the common electrode lines, the data lines, the gate lines and the thin film transistors on the array substrate and the color filter substrate are not limited to the above-described embodiments and accompanying drawings, and any structures in which the common electrode lines can apply common voltage to the common electrodes and the gate lines, the data lines and the thin film transistor can cooperate with each other to supply operating voltage for the pixel electrodes can be employed in present invention.

With an array substrate, manufacturing method thereof, a liquid crystal panel and a liquid crystal display provided in the embodiments of the present invention, the first pixel unit and the second pixel unit are alternately arranged along the direction of the data line in the array substrate, two layers of the conductive films are formed in each of the pixel units. In which, in the first pixel unit, the first conductive film layer is provided as the common electrode in the first pixel unit, the second conductive film layer is provided as the pixel electrode in the first pixel unit; in the second pixel unit, the first conductive film layer is provided as the pixel electrode in the second pixel unit, the second conductive film layer is provided as the common electrode in the second pixel. Therefore, the positions of the pixel electrode and the common electrode in the first pixel unit are opposite to those in the second pixel unit.

With an array substrate, manufacturing method thereof, a liquid crystal panel and a liquid crystal display provided in the embodiments of the present invention, the directions of electric fields in the first and the second pixel units can be reversed without the reverse driving signal sequence, so that the driving power consumption for realizing reverse drive is reduced. The point-reverse drive mode can be achieved by the liquid crystal display provided in the present invention with the use of the signal sequences of frame-reverse or column-reverse, compared with the conventional technology, the driving power consumption can be decreased.

For example, in the array substrate described above, the first conductive film layer in each pixel unit is disposed below the second conductive film layer, and therebetween segregated by an insulating layer. For example, the first conductive film layers in the pixel units are formed in the same layer, and the second conductive film layers in the pixel units are formed in the same layer. For example, the first conductive film layers in the pixel units are made of same conductive material by a mask process, and the second conductive film layers in the pixel units are made of same conductive material by a mask process.

What are described above is related to the illustrative embodiments of the disclosure only and not limitative to the scope of the disclosure; the scopes of the disclosure are defined by the accompanying claims.

What is claimed is:

1. An array substrate, comprising: a substrate; gate lines, data lines and common electrode lines disposed on said substrate, said gate lines and said data lines define a plurality of pixel units; a first transparent conductive film layer, a second transparent conductive film layer and a thin film transistor are formed in each of said pixel units; wherein,
    said pixel units comprise a first pixel unit and a second pixel unit, and the first pixel unit and the second pixel unit are alternately arranged along the direction of said data lines; wherein,
    in said first pixel unit, the first transparent conductive film layer is electrically connected with a first common electrode line selected from the common electrode lines, the second transparent conductive film layer is electrically connected with a drain electrode of the thin film transistor in said first pixel unit; in said second pixel unit, the first transparent conductive film layer is electrically connected with a drain electrode of the thin film transistor in said second pixel unit, the second transparent conductive film layer is electrically connected with a second common electrode line selected from the common electrode lines; the common electrode lines in the pixel units are electrically connected with each other,
    wherein the thin film transistor in said first pixel unit and the thin film transistor in said second pixel unit are of top-gate structure;
    in the first pixel unit, the first transparent conductive film layer is directly connected with the first common electrode line or electrically connected with the first common electrode line by a first gate insulating layer hole, the second transparent conductive film layer is connected with the drain electrode of the thin film transistor in the first pixel unit by a second gate insulating layer hole and a first passivation layer hole;
    in the second pixel unit, the first transparent conductive film layer is directly connected with the drain electrode of the thin film transistor in the second pixel unit, the second transparent conductive film layer is electrically connected with the second common electrode line by a second passivation layer hole.

2. An array substrate, comprising: a substrate; gate lines, data lines and common electrode lines disposed on said substrate, said gate lines and said data lines define a plurality of pixel units; a first transparent conductive film layer, a second transparent conductive film layer and a thin film transistor are formed in each of said pixel units; wherein,
    said pixel units comprise a first pixel unit and a second pixel unit, and the first pixel unit and the second pixel unit are alternately arranged along the direction of said data lines; wherein,
    in said first pixel unit, the first transparent conductive film layer is electrically connected with a first common electrode line selected from the common electrode lines, the second transparent conductive film layer is electrically connected with a drain electrode of the thin film transistor in said first pixel unit; in said second pixel unit, the first transparent conductive film layer is electrically connected with a drain electrode of the thin film transistor in said second pixel unit, the second transparent conductive film layer is electrically connected with a second common electrode line selected from the common electrode lines; the common electrode lines in the pixel units are electrically connected with each other, wherein the thin film transistor of the first pixel unit is of bottom-gate structure, and the thin film transistor of the second pixel unit is of top-gate structure;

in the first pixel unit, the first transparent conductive film layer is directly connected with the first common electrode line, the second transparent conductive film layer is electrically connected with the drain electrode of the bottom-gate thin film transistor by a third passivation layer hole;

in the second pixel unit, the first transparent conductive film layer is directly connected with the drain electrode of the top-gate thin film transistor, the second transparent conductive film layer is electrically connected with the second common electrode line by a second passivation layer hole.

3. The array substrate according to claim 2, wherein the first pixel unit and the second pixel unit are alternately arranged along the direction of said gate lines.

4. The array substrate according to claim 3, wherein along the direction of said gate lines, the gate line in the first pixel unit is electrically connected with the gate line in the second pixel unit which is adjacent to the first pixel unit by a third gate insulating layer hole in a gate insulating layer;
along the direction of said data lines, the data line in the first pixel unit is electrically connected with the data line in the second pixel unit which is adjacent to the first pixel unit by a fourth gate insulating layer hole in the gate insulating layer.

5. The array substrate according to claim 2, wherein along the direction of said gate lines, adjacent pixel units are all the first pixel units or the second pixel units.

6. The array substrate according to claim 5, wherein along the direction of said gate lines, the gate line in the first pixel unit is directly connected with the gate line in the second pixel unit which is adjacent to the first pixel unit;
along the direction of said data lines, the data line of the first pixel unit is electrically connected with the data line of the second pixel unit which is adjacent to the first pixel unit by a fourth gate insulating layer hole in a gate insulating layer.

7. The array substrate according to claim 1, wherein said first pixel unit and said second pixel unit are alternately arranged along the direction of said gate lines; or
along the direction of said gate lines, adjacent pixel units are all the first pixel units or all the second pixel units.

8. The array substrate according to claim 7, wherein:
along the direction of said gate lines, the gate lines in the adjacent pixel units are connected with each other in the same layer;
along the direction of the data lines, the data lines in the adjacent pixel units are connected with each other in the same layer.

9. The array substrate according to claim 1, wherein:
along the direction of the gate lines, if the common electrode lines in adjacent pixel units are in the same layer, the common electrode lines in adjacent pixel units are directly connected with each other;
along the direction of said gate lines, if the common electrode lines in adjacent pixel units are in different layers, the common electrode lines in adjacent pixel units are electrically connected with each other by holes.

10. The array substrate according to claim 1, wherein:
in each of the pixel units, the first transparent conductive film layer is below the second transparent conductive film layer, and the first and second transparent conductive film layer are segregated by an insulating layer therebetween.

11. The array substrate according to claim 10, wherein:
the first transparent conductive film layers in the pixel units are formed in the same layer, and the second transparent conductive films layer in the pixel units are formed in the same layer.

12. A method of manufacturing an array substrate, said array substrate comprising a first pixel unit and a second pixel unit, said method comprising:
depositing a first transparent conductive material on a substrate, and forming a pattern of a first transparent conductive film layer corresponding to both the first pixel unit and the second pixel unit by a first mask process; wherein said first pixel unit and said second pixel unit are alternately arranged along the direction of data lines;
forming a first metal film layer and a first semiconductor film layer on the substrate formed with the first transparent conductive film layer, and forming a first gate line, a first gate electrode and a first common electrode line corresponding to the first pixel unit by a second mask process, and forming a second drain electrode, a second source electrode, a second active layer and a second data line corresponding to the second pixel unit;
depositing a gate insulating layer, and forming holes in the gate insulating layer by a third mask process;
fabricating a second semiconductor film layer and a second metal film layer, and forming a first active layer, a first source electrode, a first drain electrode and a first data line corresponding to the first pixel unit by a fourth mask process, and forming a second gate line, a second gate electrode and a second common electrode line corresponding to the second pixel unit;
depositing a passivation layer, and forming holes in the passivation layer by a fifth mask process;
depositing a second transparent conductive material, and forming a pattern of a second transparent conductive film layer corresponding to both the first pixel unit and the second pixel unit by a sixth mask process; wherein in the first pixel unit, the second transparent conductive film layer is electrically connected with the first drain electrode by one hole selected from the holes in the passivation layer, in the second pixel unit, the second transparent conductive film layer is electrically connected with the second common electrode line by another hole selected from the holes in the passivation layer.

13. The array substrate according to claim 2, wherein:
along the direction of the gate lines, if the common electrode lines in adjacent pixel units are in the same layer, the common electrode lines in adjacent pixel units are directly connected with each other;
along the direction of said gate lines, if the common electrode lines in adjacent pixel units are in different layers, the common electrode lines in adjacent pixel units are electrically connected with each other by holes.

14. The array substrate according to claim 2, wherein:
in each of the pixel units, the first transparent conductive film layer is below the second transparent conductive film layer, and the first and second transparent conductive film layer are segregated by an insulating layer therebetween.

15. The array substrate according to claim 14, wherein:
the first transparent conductive film layers in the pixel units are formed in the same layer, and the second transparent conductive films layer in the pixel units are formed in the same layer.

* * * * *